(12) United States Patent
Ho et al.

(10) Patent No.: US 10,276,508 B2
(45) Date of Patent: Apr. 30, 2019

(54) SEMICONDUCTOR PACKAGES AND METHODS OF FORMING THE SAME

(71) Applicant: Taiwan Semiconductor Manufacturing Co., Ltd., Hsinchu (TW)

(72) Inventors: Kuan-Lin Ho, Hsinchu (TW); Chin-Liang Chen, Kaohsiung (TW); Chi-Yang Yu, Taoyuan (TW); Yu-Min Liang, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/719,493

(22) Filed: Sep. 28, 2017

(65) Prior Publication Data

US 2019/0096816 A1   Mar. 28, 2019

(51) Int. Cl.

| | |
|---|---|
| *H01L 23/495* | (2006.01) |
| *H01L 23/538* | (2006.01) |
| *H01L 23/31* | (2006.01) |
| *H01L 23/00* | (2006.01) |
| *H01L 21/56* | (2006.01) |
| *H01L 21/48* | (2006.01) |
| *H01L 21/78* | (2006.01) |
| *H01L 23/367* | (2006.01) |

(52) U.S. Cl.
CPC ...... *H01L 23/5389* (2013.01); *H01L 21/4853* (2013.01); *H01L 21/4857* (2013.01); *H01L 21/4871* (2013.01); *H01L 21/561* (2013.01); *H01L 21/565* (2013.01); *H01L 21/568* (2013.01); *H01L 21/78* (2013.01); *H01L 23/3114* (2013.01); *H01L 23/3675* (2013.01); *H01L 23/5383* (2013.01); *H01L 23/5386* (2013.01); *H01L 24/20* (2013.01); *H01L 24/96* (2013.01); *H01L 2224/214* (2013.01); *H01L 2224/95001* (2013.01)

(58) Field of Classification Search
CPC . H01L 23/5389; H01L 21/568; H01L 21/561; H01L 21/4853; H01L 21/565; H01L 21/78; H01L 21/4857
USPC .......................................................... 257/668
See application file for complete search history.

(56) References Cited

U.S. PATENT DOCUMENTS

| | | | |
|---|---|---|---|
| 7,417,299 B2 * | 8/2008 | Hu .......................... | H01L 23/36 257/528 |
| 7,449,363 B2 * | 11/2008 | Hsu ..................... | H01L 23/5389 257/685 |
| 7,892,882 B2 * | 2/2011 | Leal ....................... | H01L 23/36 257/678 |
| 9,000,584 B2 | 4/2015 | Lin et al. | |

(Continued)

*Primary Examiner* — Luan C Thai
(74) *Attorney, Agent, or Firm* — JCIPRNET

(57) ABSTRACT

Semiconductor packages and methods of forming the same are disclosed. The semiconductor package includes a plurality of chips, a first molding compound, a first redistribution structure, a second molding compound and a second redistribution structure. The first molding compound encapsulates the chips. The first redistribution structure is disposed over the plurality of chips and the first molding compound. The second molding compound surrounds the first molding compound. The second redistribution structure is disposed over the first redistribution structure, the first molding compound and the second molding compound.

20 Claims, 13 Drawing Sheets

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,607,919 B2 * | 3/2017 | Lee ............... H01L 23/3135 |
| 2018/0226333 A1 * | 8/2018 | Shih ............... H01L 23/49838 |

* cited by examiner

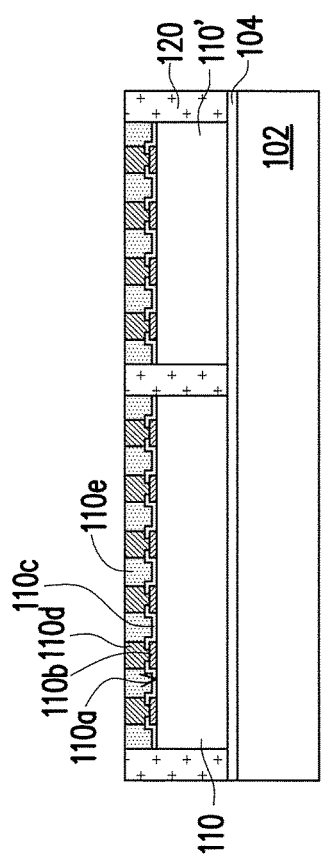
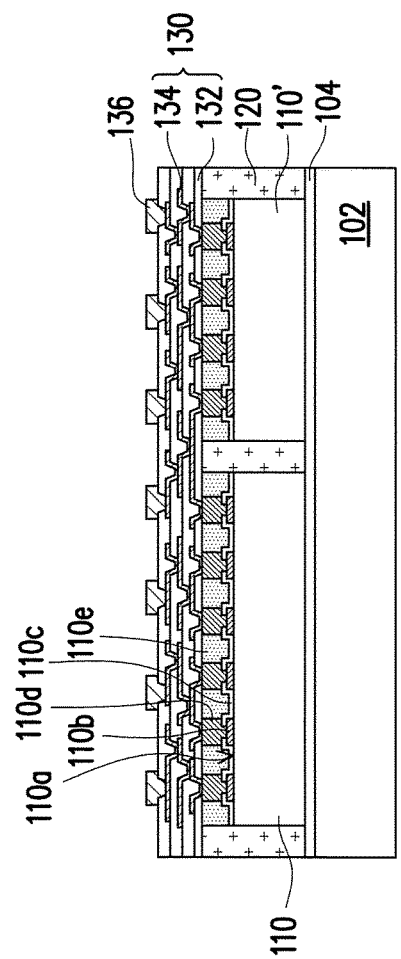
FIG. 1A
FIG. 1B

SEMICONDUCTOR PACKAGES AND METHODS OF FORMING THE SAME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 1A to FIG. 1G are schematic cross sectional views of various stages in a manufacturing method of a semiconductor package according to some exemplary embodiments.

DETAILED DESCRIPTION

Figure 1C:
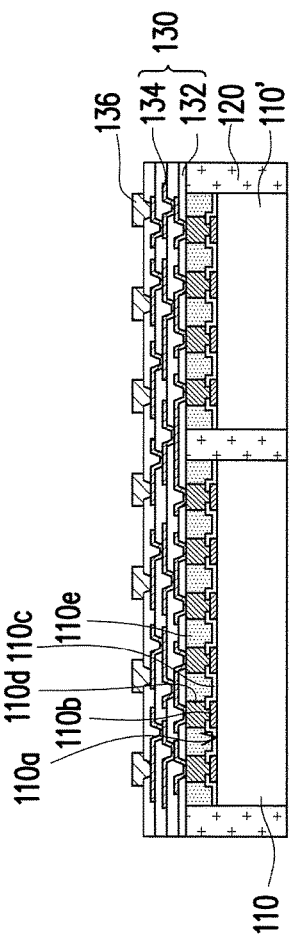

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution structure or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic cross sectional views of various stages in a manufacturing method of a semiconductor package according to some exemplary embodiments.

Referring to FIG. 1A, a carrier 102 is provided, and a plurality of chips 110, 110' is placed onto the carrier 102. In some embodiments, an adhesive layer 104 is formed between the carrier 102 and the chips 110, 110'. In some embodiments, the carrier 102 may include semiconductor material, glass, glass fiber, resin, fillers, other materials, and/or combinations thereof.

By using the adhesive layer 104, the chips 110, 110' are mounted onto the carrier 102. In some embodiments, the chips 110, 110' may be different types of chips. In alternative embodiments, the chips 110, 110' may be the same types of chips. In some embodiments, the chips 110, 110' may be used for high performance computing system. In alternative embodiments, the chips 110, 110' may be digital chips, analog chips or mixed signal chips, such as application-specific integrated circuit ("ASIC") chips, high bandwidth memory (HBM) chips, sensor chips, wireless and radio frequency chips, memory chips, logic chips or voltage regulator chips. In some embodiments, two chips are shown to represent plural chips, and the disclosure is not limited thereto. For example, the chips 110, 110' may be arranged in an array over the carrier 102.

Figure 6:
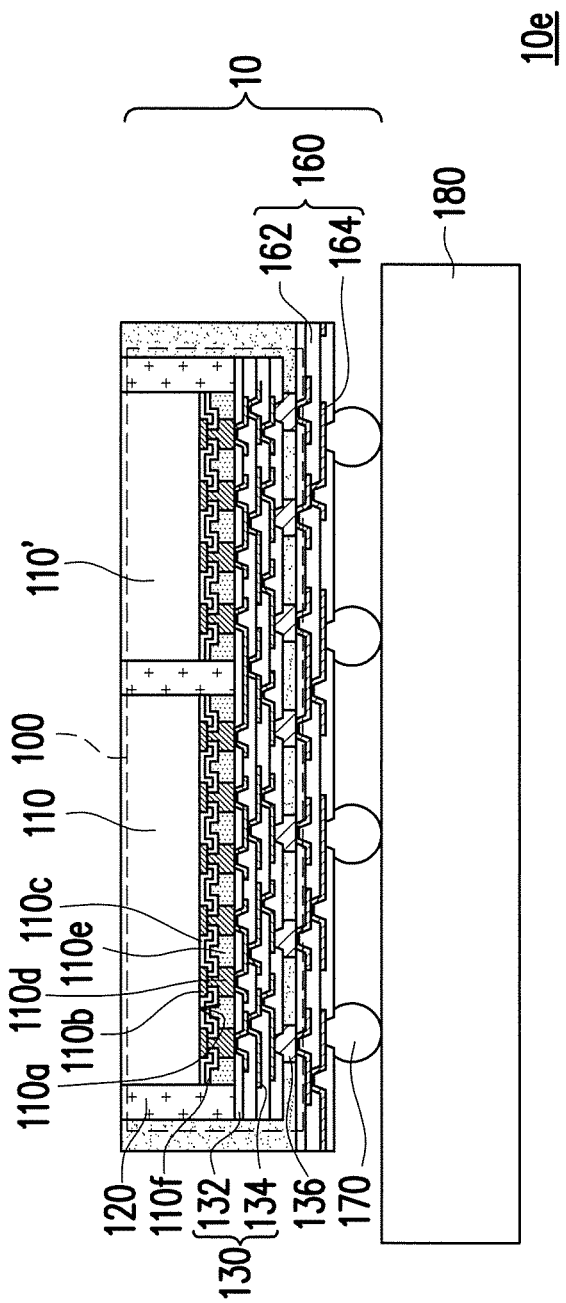
FIG. 6 is a schematic cross sectional view illustrating a semiconductor package according to some exemplary embodiments.

In some embodiments, each of the chips 110, 110' includes an active surface 110a, a plurality of pads 110b distributed on the active surface 110a, a passivation layer 110c covering the active surface 110a, a plurality of conductive pillars 110d, and a protection layer 110e, for example. The pads 110b are partially exposed by the passivation layer 110c, the conductive pillars 110d are disposed on and electrically connected to the pads 110b, and the protection layer 110e covers the conductive pillars 110d and the passivation layer 110c. The conductive pillars 110d are copper pillars or other suitable metal pillars, for example. In some embodiments, the protection layer 110e may be a polybenzoxazole (PBO) layer, a polyimide (PI) layer or other suitable polymers. In some alternative embodiments, the protection layer 110e may be made of inorganic materials. However, the structure of the chips 110, 110' are merely for illustration, and the disclosure is not limited thereto. For example, in some embodiments, as shown in FIG. 6, in a semiconductor package 10e, a dielectric layer 110f is formed over the passivation layer 110c, and the pads 110b are partially exposed by the passivation layer 110c and the dielectric layer 110f. In some embodiments, the dielectric layer 110f may be a polybenzoxazole (PBO) layer, a polyimide (PI) layer or other suitable polymers. In addition, in alternative embodiments, the conductive pillars 110d may have solder layers (not shown) thereon, or the protection layer 110e may be omitted.

A molding compound 120 is formed over the carrier 102 to encapsulate the chips 110, 110'. The molding compound 120 is formed aside the chips 110, 110' and between the chips 110, 110'. In some embodiments, the molding compound 120 is formed by a molding process. In some embodiments, the molding compound 120 may include epoxy or other suitable materials.

In some embodiments, the conductive pillars 110d may have solder layers (not shown) thereon, and the molding compound 120 and the solder layers are grinded until top surfaces of the conductive pillars 110d are exposed. During the aforementioned grinding process, portions of the protection layer 110e may be also grinded. In other words, the molding compound 120 exposes at least part of the chips 110, 110'. In some embodiments, a top surface of the molding compound 120 is substantially coplanar with top surfaces of the chips 110, 110', and coplanar with the top surfaces of the conductive pillars 110d, for example. In some embodiments, the molding compound 120 may be formed by a mechanical grinding, a chemical mechanical polishing (CMP), or another suitable mechanism.

Referring to FIG. 1B, after the molding compound 120 is formed, a redistribution structure 130 is formed over the chips 110, 110' and the molding compound 120, so as to form a package unit 100. In some embodiments, the redistribution structure 130 is formed on the top surface of the molding compound 120 and the top surfaces of the conductive pillars 110d and the protection layers 110e of the chips 110, 110'. As shown in FIG. 1B, the redistribution structure 130 includes a plurality of inter-dielectric layers 132 and a plurality of redistribution conductive patterns 134 stacked alternately. The redistribution conductive patterns 134 are electrically connected to the conductive pillars 110d embedded in the protection layers 110e. In some embodiments, the top surfaces of the conductive pillars 110d are in contact with the bottommost redistribution conductive patterns 134 of the redistribution structure 130. The top surfaces of the conductive pillars 110d are partially covered by the bottommost inter-dielectric layer 132. In some embodiments, the topmost redistribution conductive patterns 134 include a plurality of connection pads 136. The number, the size and the spacing of the connection pads 136 are not limited in this disclosure. It is noted that, in some embodiments, controlled collapse chip connection (C4) bumps are not required.

Referring to FIG. 1C, the package unit 100 is separated from the carrier 102. That is, the carrier 102 is removed. In some embodiments, the package unit 100 includes the chips 110, 110' encapsulated by the molding compound 120 and the redistribution structure 130. The package unit 100 is an INFO (Integrated Fan-out) package.

Figure 1D:
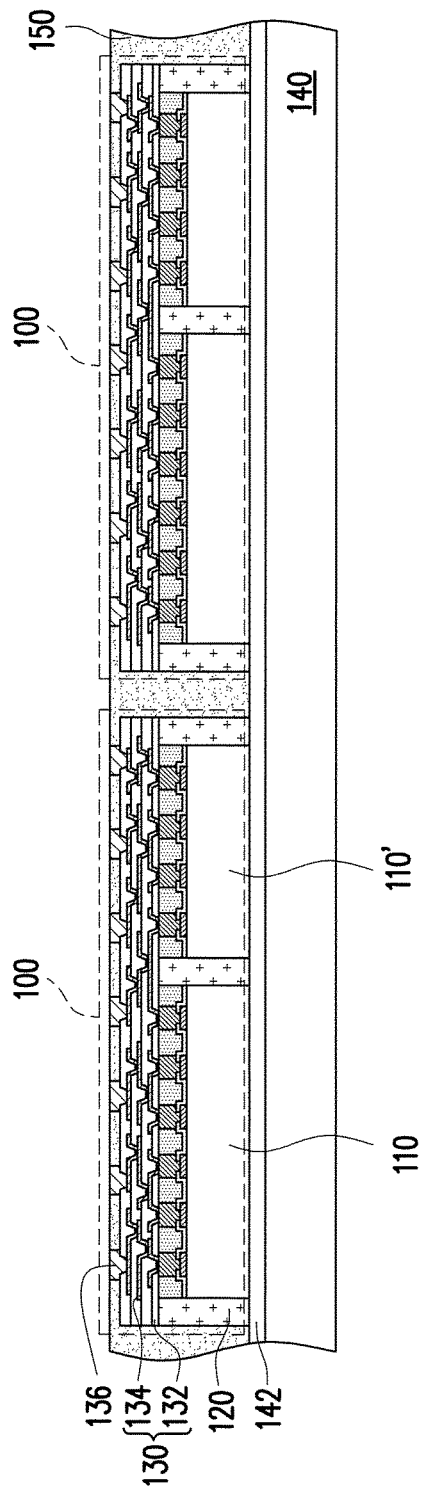

Referring to FIG. 1D, a plurality of package units 100 is placed over a carrier 140. In some embodiments, two package units 100 are illustrated, and the disclosure is not limited thereto. In alternative embodiments, more than two package units are placed over the carrier 140. In addition, the package units 100 may be of the same types or different types. A material of the carrier 140 may be the same as or different from the carrier 102. The carrier 140 may include a semiconductor material, glass, glass fiber, resin, a filler, other materials, and/or combinations thereof. In some embodiments, the package units 100 are mounted onto the carrier 140 by using a de-bonding layer 142. The de-bonding layer 142 may be a light-to heat-conversion (LTHC) release layer, a die attach film (DAF) or other suitable material.

A molding compound 150 is formed over the carrier 140 to encapsulate the package units 100. The molding compound 150 is formed aside the package units 100 and between the package units 100, and the molding compound 150 is not formed between the chips 110, 110'. The molding compound 150 surrounds the molding compound 120 and is directly contact with the molding compound 120. A material of the molding compound 150 is the same as or different from the molding compound 120. In some embodiments, the molding compound 150 may include epoxy or other suitable materials. Since the molding compound 120 and the molding compound 150 are formed sequentially, an interface is formed between the molding compound 120 and the molding compound 150. In some embodiments, the molding compound 150 is formed by a molding process. In some embodiments, a top surface of the molding compound 150 is substantially coplanar with top surfaces of the package units 100, and coplanar with a top surface of the redistribution structure 130, for example.

Figure 1E:
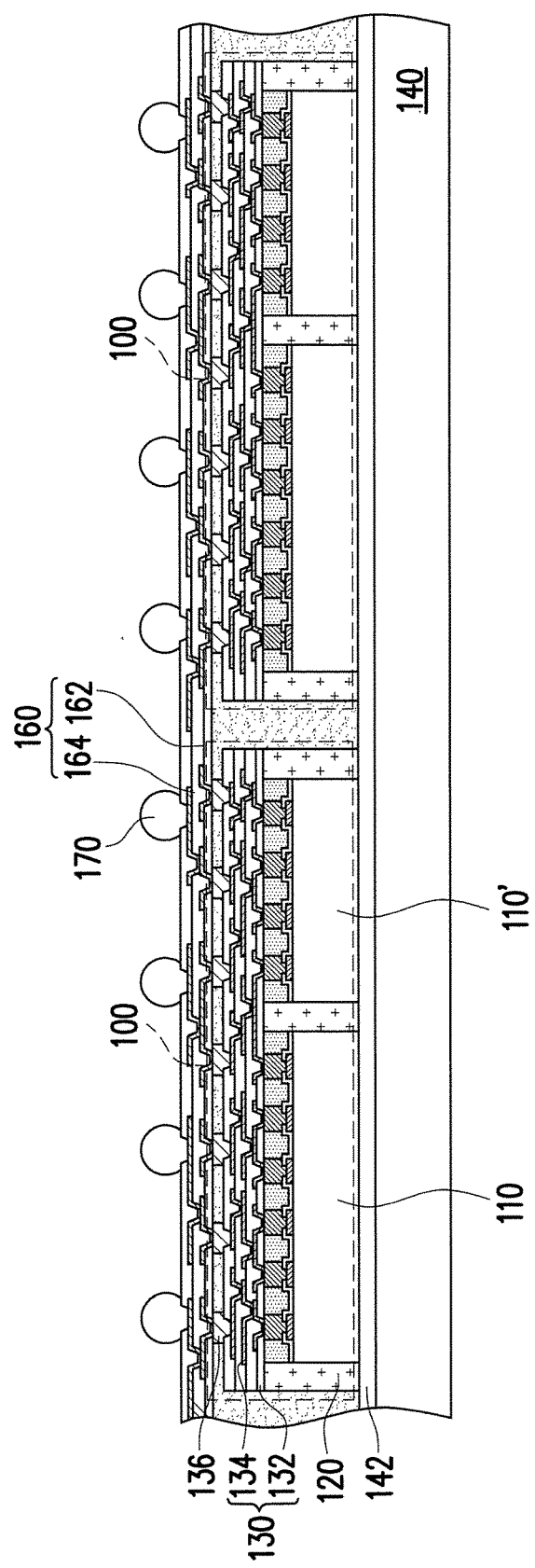

Referring to FIG. 1E, a redistribution structure 160 is formed over the package units 100 and the molding compound 150 to electrically connect to the redistribution structure 130. In some embodiments, the redistribution structure 160 is formed on the top surface of the molding compound 150 and the top surface of the redistribution structure 130. In some embodiments, the redistribution structure 160 includes a plurality of inter-dielectric layers 162 and a plurality of redistribution conductive patterns 164 stacked alternately. The redistribution conductive patterns 164 are electrically connected to the redistribution structure 130. In some embodiments, the top surface of the redistribution structure 130 are in contact with the bottommost redistribution conductive patterns 164 of the redistribution structure 160. The top surface of the redistribution structure 130 are partially covered by the bottommost inter-dielectric layer 162.

After the redistribution structure 160 is formed, a plurality of conductive terminals 170 is placed on the topmost redistribution conductive patterns 164 such as the under-ball metallurgy patterns. In some embodiments, the conductive terminals 170 may be placed on the topmost redistribution conductive patterns 164 through a ball placement process or other suitable processes. In some embodiments, the conductive terminals 170 may be ball grid arrays (BGAs), for example.

Figure 1F:
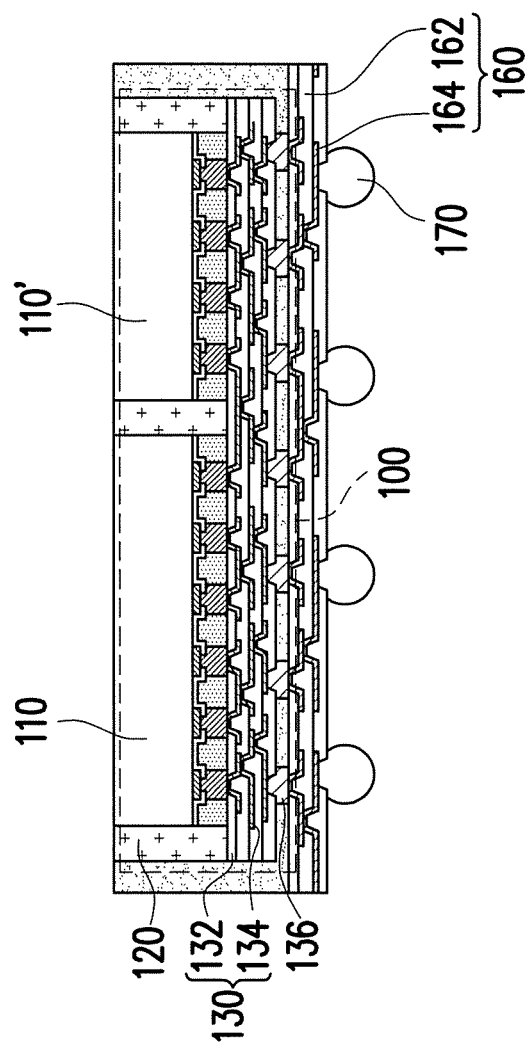

Referring to FIG. 1F, after the conductive terminals 170 are mounted on the redistribution structure 160, the package units 100 (also referred as an integrated fan-out (INFO) package array) with the redistribution structure 160 thereon are diced to form a plurality of semiconductor packages 10. In some embodiments, the dicing process or singulation process typically involves dicing with a rotating blade or a laser beam. In other words, the dicing or singulation process is, for example, a laser cutting process, a mechanical cutting process, or other suitable processes.

Then, the semiconductor packages 10 are de-bonded from the de-bonding layer 142 such that the semiconductor packages 10 are separated from the carrier 140. In some embodiments, the de-bonding layer 142 (e.g., the LTHC release layer) may be irradiated by an UV laser such that the molding compound 150 and lower portions of the semiconductor package 10 are peeled from the carrier 140. As shown in FIG. 1F, the semiconductor package 10 is turned upside down, the top surfaces may become the bottom surfaces and the relative positional relationships (such as above, below, higher or lower) may become the opposite for the package structures as described above, but the same surfaces, common surfaces or interfaces will be marked with the same reference numbers.

Figure 1G:
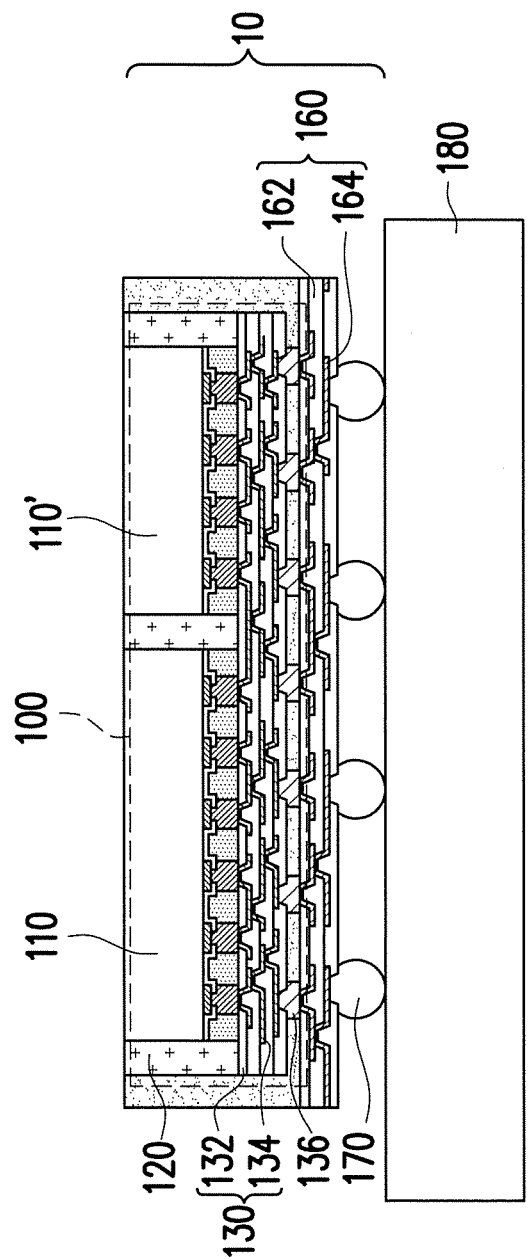

Referring to FIG. 1G, the package unit 100 is stacked with an electronic device 180. In some embodiments, the electronic device 180 is a board such as a printed circuit board, a die, a substrate carrier or a package.

In some embodiments, in the semiconductor package 10, at one side, edges of the redistribution structure 160, the redistribution structure 130 and the outermost chip 110 form a step. In other words, the edge of the redistribution structure 130 is disposed between the edges of the redistribution structure 160 and the outermost chip 110, and the circuit of the outermost chip 110 sequentially fans out through the redistribution structure 130 and the redistribution structure 160. Similarly, at another side, edges of the redistribution structure 160, the redistribution structure 130 and the outermost chip 110' also form a step. In some embodiments, bumps such as C4 bumps are not required, and a substrate to which the C4 bumps is attached is also omitted. Accordingly, the integration risk due to coefficient of thermal expansion (CTE) mismatch of the chips, the bumps and the substrate is prevented. Furthermore, the bumps and the substrate are not required, and thus the process is simplified, the cost is reduced, and the thickness of the INFO package is decreased. Therefore, the thermal and electrical behavior of the INFO package is improved.

In the exemplary embodiments, the carriers are removed, and the disclosure is not limited thereto. In some embodiments, if required, one of the carriers may be remained.

FIG. 2A to FIG. 2D are schematic cross sectional views of various stages in a manufacturing method of a semiconductor package according to some exemplary embodiments. The elements similar to or substantially the same as the elements described above will use the same reference numbers, and certain details or descriptions of the same elements will not be repeated herein.

Figure 2A:
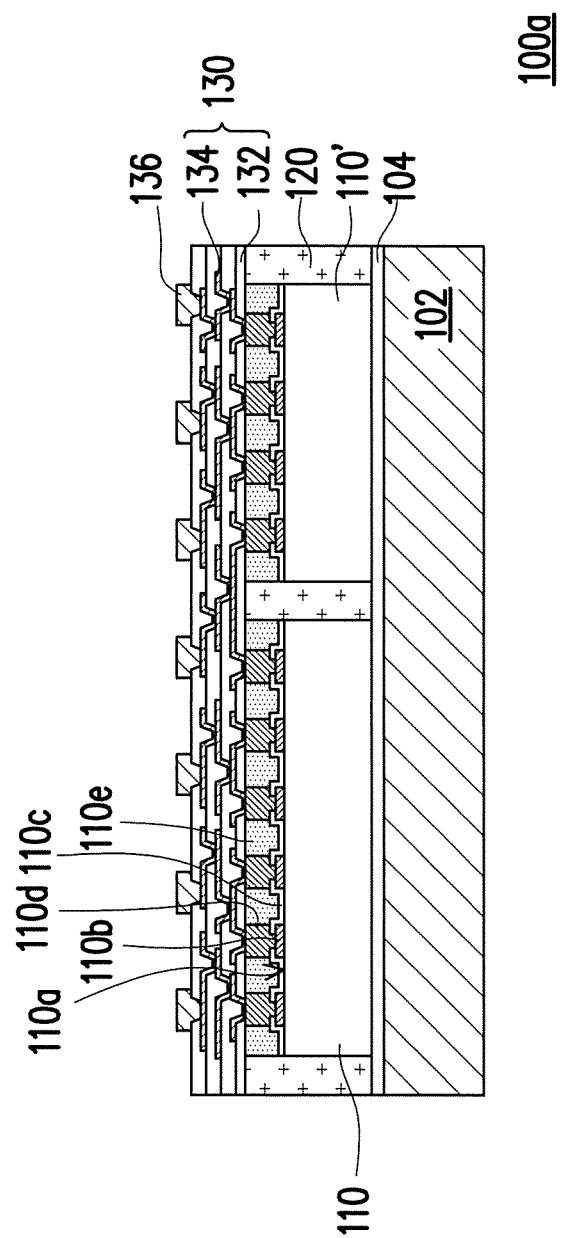
FIG. 2A to FIG. 2D are schematic cross sectional views of various stages in a manufacturing method of a semiconductor package according to some exemplary embodiments.

Referring to FIG. 2A, a plurality of chips 110, 110' is encapsulated by a molding compound 120 over a carrier 102. In some embodiments, the carrier 102 includes a heat-spreading or heat-sinking material such as a metal. The carrier 102 may include copper, copper/nicole or other metals, for example. The carrier 102 may has a thickness ranging from about 0.5 mm to about 5 mm. In some embodiments, the chips 110, 110' are placed on the carrier 102 through an adhesive layer 104. The adhesive layer 104 includes a thermal interface material (TIM), an adhesive TIM, other materials, or a combination thereof. The TIM may be a thermally conductive gel, paste, grease, or a phase change material with the greatest possible thermal conductivity, typically between about 0.5 W/(m·K) and 100 W/(m·K). For example, the thermally conductive grease may be a ceramic or metal, such as beryllium oxide, aluminum nitride, aluminum oxide, zinc oxide, silver, aluminum, or the like, suspended in a silicone-based gel. In some embodiments, after the molding compound 120 is applied and/or cured, the chips 110, 110' are attached to the carrier 102. However, materials and thickness of the carrier 102 and the adhesive layer 104 are merely for illustration, and the disclosure is not limited thereto.

After the molding compound 120 is formed, a redistribution structure 130 is formed over the chips 110, 110' and the molding compound 120, so as to form a package unit 100a. In some embodiments, the package unit 100a includes the carrier 102, the adhesive layer 104, the chips 110, 110' encapsulated by the molding compound 120 and the redistribution structure 130. The package unit 100a is an INFO package. It is noted that, in some embodiments, controlled collapse chip connection (C4) bumps are not required.

Figure 2B:
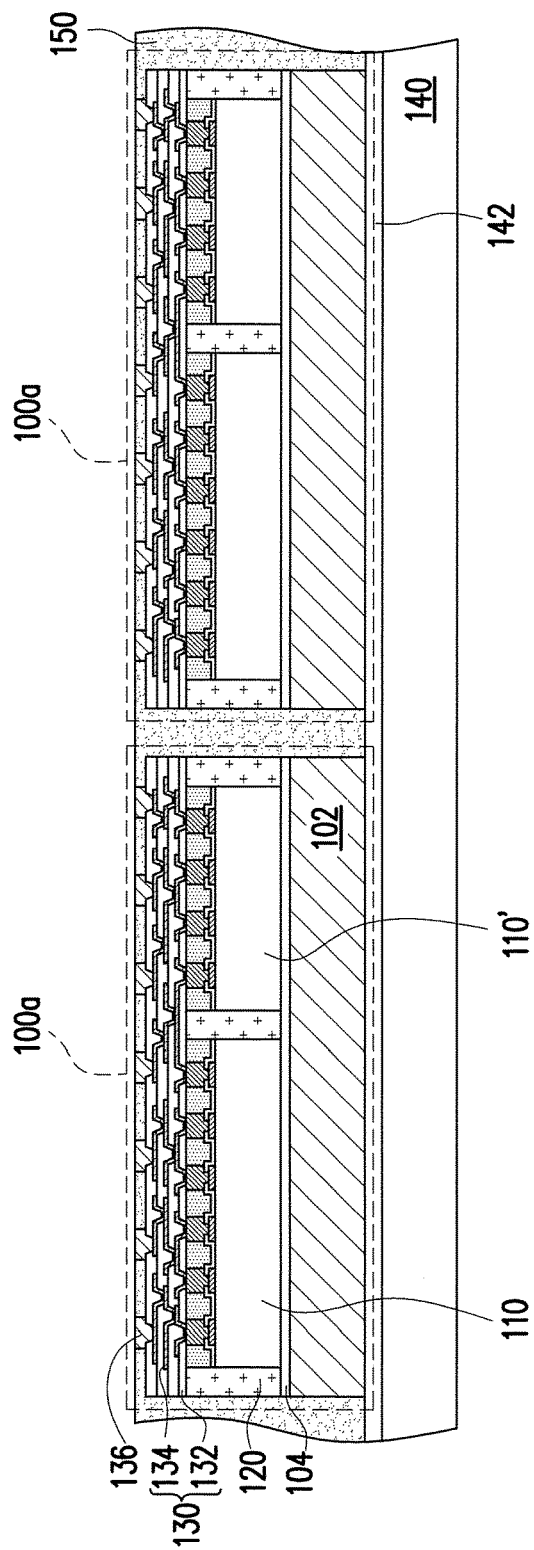

Referring to FIG. 2B, a plurality of package units 100a is encapsulated by a molding compound 150 over a carrier 140. In some embodiments, a material of the carrier 140 is different from the carrier 102. The carrier 140 may include a semiconductor material, glass, glass fiber, resin, a filler, other materials, and/or combinations thereof. In some embodiments, the package units 100a are mounted onto the carrier 140 by using a de-bonding layer 142. The de-bonding layer 142 may be a light-to heat-conversion (LTHC) release layer, a die attach film (DAF) or other suitable material.

Figure 2C:
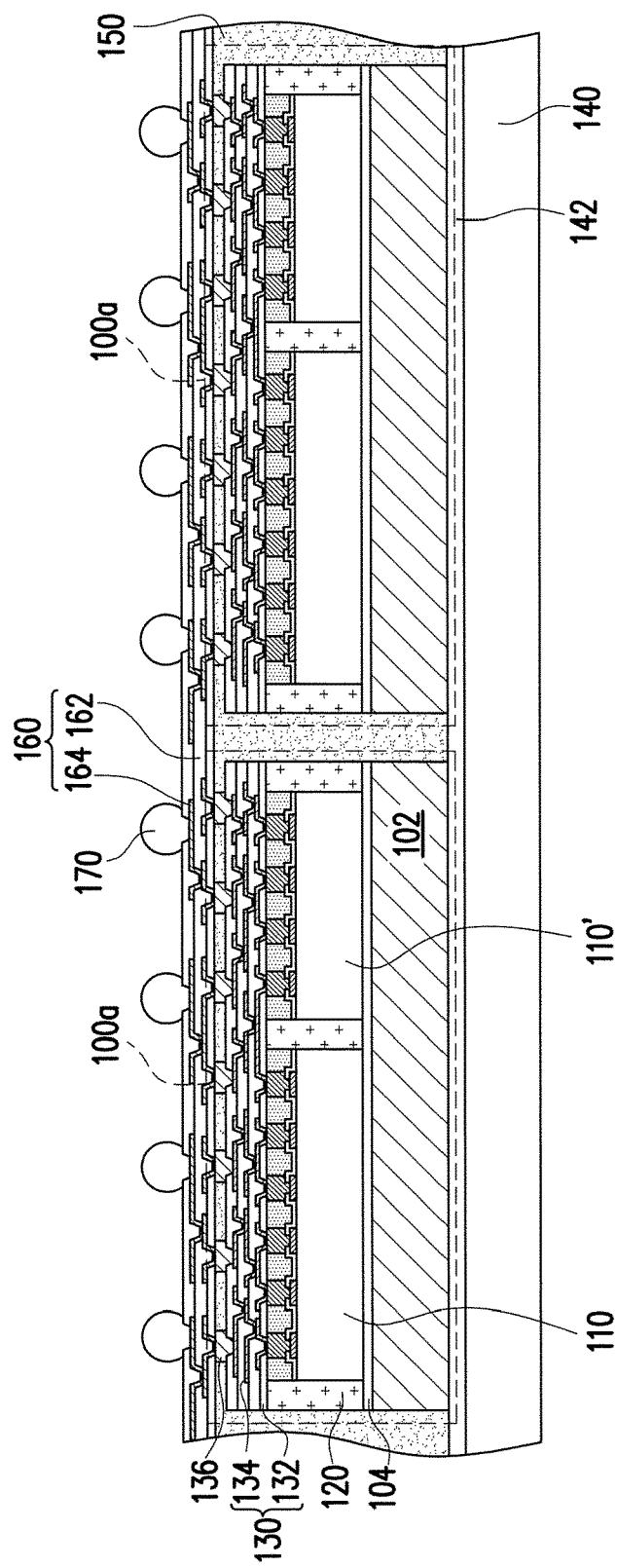

Referring to FIG. 2C, after the molding compound 150 is formed, a redistribution structure 160 is formed over the package units 100a and the molding compound 150 to electrically connect to the redistribution structure 130. In some embodiments, the redistribution structure 160 includes a plurality of inter-dielectric layers 162 and a plurality of redistribution conductive patterns 164 stacked alternately. Then, a plurality of conductive terminals 170 is placed on the topmost redistribution conductive patterns 164 of the redistribution structure 160.

Figure 2D:
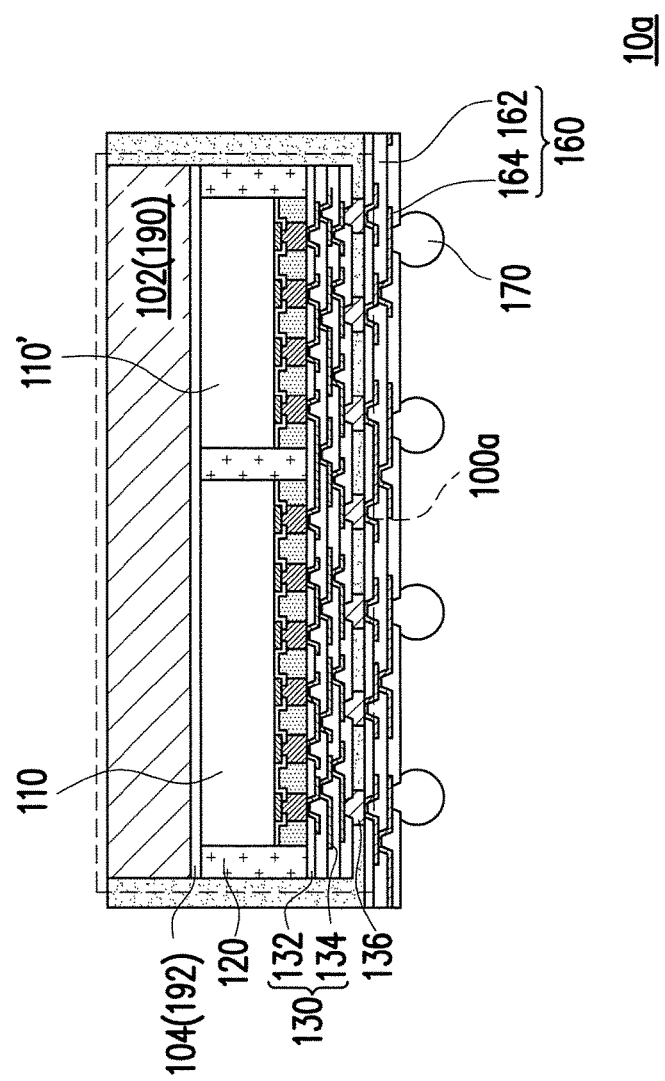

Referring to FIG. 2D, after the conductive terminals 170 are mounted on the redistribution structure 160, the package units 100a with the redistribution structure 160 thereon are diced to form a plurality of semiconductor packages 10a. Then, the semiconductor packages 10a are de-bonded from the de-bonding layer 142 such that the semiconductor packages 10a are separated from the carrier 140. As shown in FIG. 2D, the semiconductor packages 10a is turned upside down, the top surfaces may become the bottom surfaces and the relative positional relationships (such as above, below, higher or lower) may become the opposite for the package structures as described above, but the same surfaces, common surfaces or interfaces will be marked with the same reference numbers.

In some embodiments, the carrier 102 serves as a conductive lid 190 of the semiconductor packages 10a for heat-spreading of the integrated circuit die and package. In addition, the adhesive layer 104 serves as an adhesive layer 192 providing attachment between the conductive lid 190 and the chips 110, 110'. Accordingly, the semiconductor packages 10a includes the chips 110, 110', the molding compound 120 encapsulating the chips 110, 110', the redistribution structure 130 over the chips 110, 110', the molding compound 150 surrounding the molding compound 120, the redistribution structure 160 over the redistribution structure 130, the conductive terminals 170, the adhesive layer 192 and the conductive lid 190. In some embodiments, sides of the conductive lid 190 is encapsulated by the molding compound 150. The conductive lid 190 and the adhesive layer 104 have a size substantially the same as the package unit 100a, and thus covers entirely the package unit 100a.

That is, sides of the conductive lid 190 are substantially aligned with sides of the package unit 100a.

Figure 3:
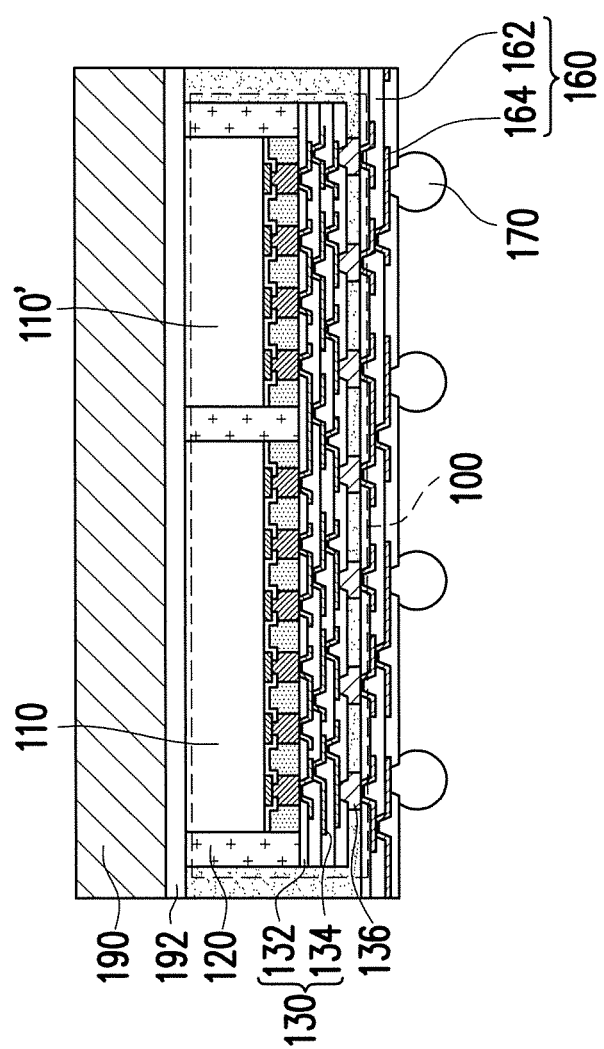
FIG. 3 is a schematic cross sectional view illustrating a semiconductor package according to some exemplary embodiments.

FIG. 3 is a schematic cross sectional view illustrating a semiconductor package according to some exemplary embodiments. In FIG. 3, a semiconductor package 10b similar to the structure as shown in FIG. 1F is described, except the carrier 140 in FIG. 1E is not removed and serves as a conductive lid 190 over the chips 110, 110'. In addition, the adhesive layer 144 serves as an adhesive layer 192 providing attachment between the conductive lid 190 and the chips 110, 110'. In other words, the forming method of the semiconductor package 10b is similar to the forming method depicted in FIGS. 1A to 1E. However, the diced semiconductor package 10b is not separated from the carrier 140. In some embodiments, materials of the carrier 140 and the adhesive layer 142 are similar to those described for the carrier 102 and the adhesive layer 104 of the semiconductor packages 10a. Accordingly, the semiconductor packages 10b includes the chips 110, 110', the molding compound 120 encapsulating the chips 110, 110', the redistribution structure 130 over the chips 110, 110', the molding compound 150 surrounding the molding compound 120, the redistribution structure 160 over the molding compound 150, the conductive terminals 170, the adhesive layer 192 and the conductive lid 190. In some embodiments, sides of the conductive lid 190 are exposed. The conductive lid 190 and the adhesive layer 104 have a size substantially the same as the semiconductor package 10b, and thus covers entirely the semiconductor package 10b. That is, sides of the conductive lid 190 are substantially aligned with sides of the molding compound 150.

In above embodiments, one of the carriers 102, 140 is not removed and functions as a heat sinking element and thus one of the removal processes of the carriers 102, 140 and additional process for forming the heat sinking element are omitted. Therefore, the manufacturing method of the semiconductor package with a good heat-spreading or heat-sinking performance is simplified, and the cost thereof is reduced.

In above embodiments, the heat sinking element is derived from the carrier, and thus a size of the heat sinking element is substantially the same as the package unit or the semiconductor package, and the disclosure is not limited thereto. In alternative embodiments, the size of the heat sinking element may be adjusted according to the requirements. In addition, the heat sinking element may be formed after the dicing process.

Figure 4:
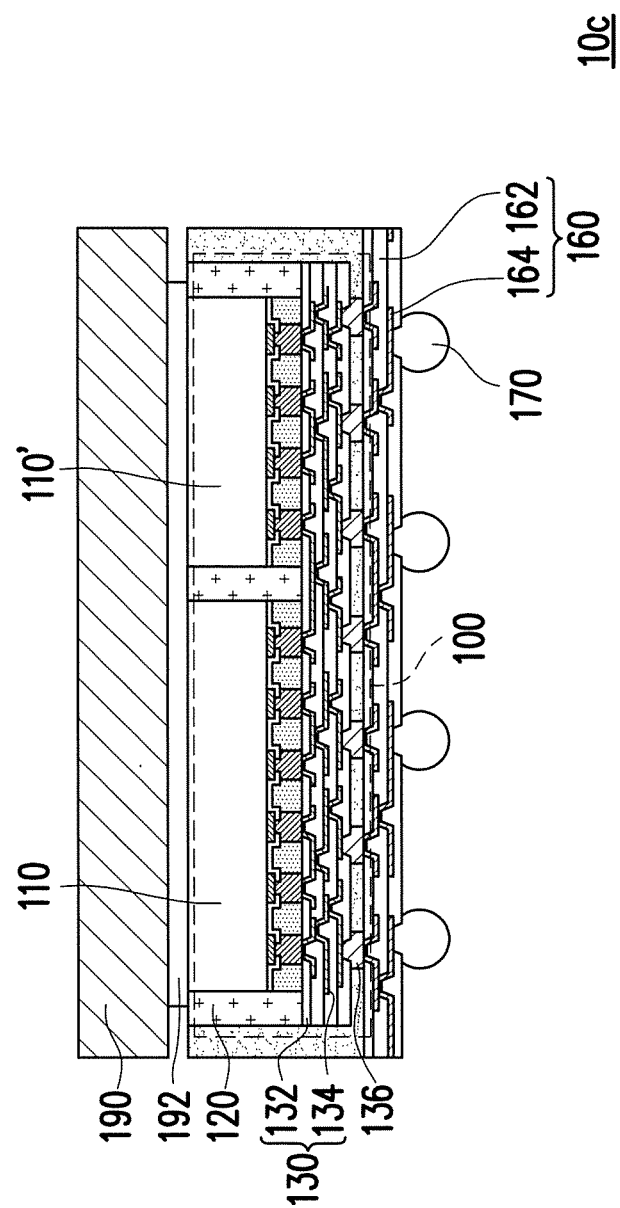
FIG. 4 is a schematic cross sectional view illustrating a semiconductor package according to some exemplary embodiments.

FIG. 4 is a schematic cross sectional view illustrating a semiconductor package according to some exemplary embodiments. In FIG. 4, a semiconductor package 10c similar to the structure as shown in FIG. 1F is described, except a conductive lid 190 is additionally formed over the chips 110, 110'. In some embodiments, the conductive lid 190 is disposed on the chips 110, 110' by using an adhesive layer 192. In some embodiments, the conductive lid 190 has a size substantially the same as the semiconductor package 10c. That is, sides of the conductive lid 190 are substantially aligned with sides of the semiconductor package 10c, and thus the conductive lid 190 covers the chips 110, 110' and the molding compound 120, 150. Furthermore, a size of the adhesive layer 192 is smaller than the conductive lid 190, and thus the adhesive layer 192 is not entirely formed between the conductive lid 190 and the molding compound 120, 150. Accordingly, the bottom of the conductive lid 190 and the top of the molding compound 120, 150 are partially exposed, and the disclosure is not limited thereto. In alternative embodiments, the adhesive layer may be entirely formed between the conductive lid and the molding compound.

Figure 5:
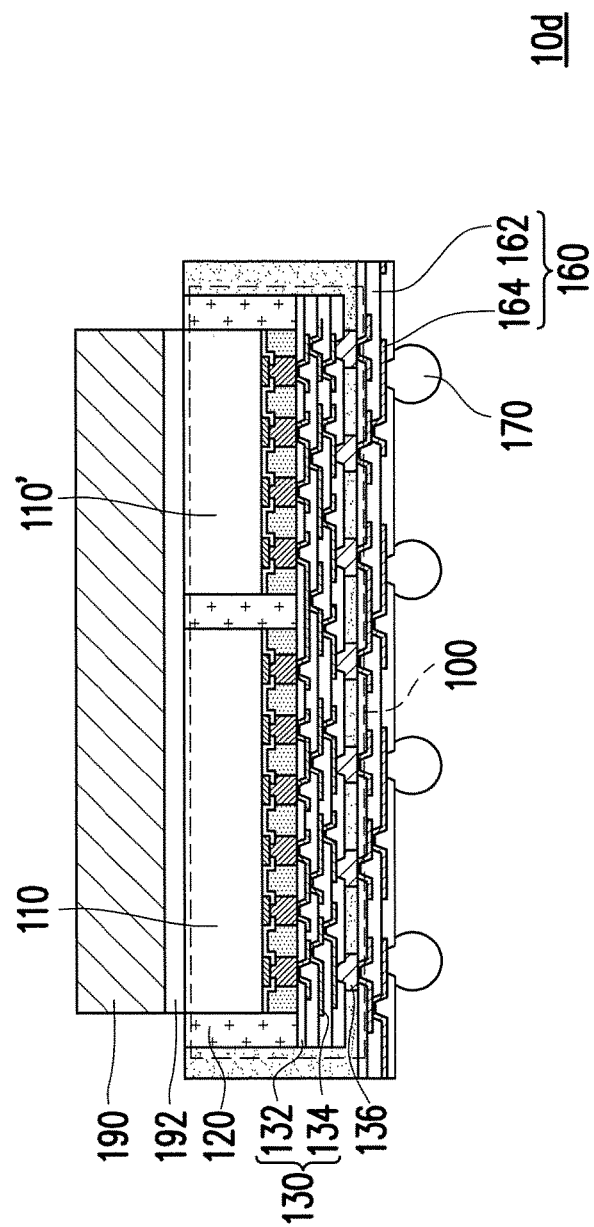
FIG. 5 is a schematic cross sectional view illustrating a semiconductor package according to some exemplary embodiments.

In some embodiments, as shown in FIG. 5, the conductive lid 190 has a size substantially smaller than the semiconductor package 10d, and thus at least a portion of the molding compound 120, 150 is exposed. In some embodiments, the conductive lid 190 and adhesive layer 192 have a size similar to the package unit 100, and the disclosure is not limited thereto.

In some embodiments, the semiconductor package is formed by twice INFO processes and twice molding processes, and thus the semiconductor package has a novel structure, in which C4 bumps and a substrate to which the C4 bumps is attached are omitted. Accordingly, the integration risk due to CTE mismatch of the chips, the bumps and the substrate is prevented. Furthermore, the bumps and the substrate are not required, and the carrier may be remained and function as a lid. Thus, the forming method of the semiconductor package is simplified, the cost is reduced, and the thickness of the semiconductor package is decreased. Accordingly, the thermal and electrical behavior of the semiconductor package is improved.

In accordance with some embodiments of the present disclosure, a semiconductor package includes a plurality of chips, a first molding compound, a first redistribution structure, a second molding compound and a second redistribution structure. The first molding compound encapsulates the chips. The first redistribution structure is disposed over the plurality of chips and the first molding compound. The second molding compound surrounds the first molding compound. The second redistribution structure is disposed over the first redistribution structure, the first molding compound and the second molding compound.

In accordance with alternative embodiments of the present disclosure, a semiconductor package includes a redistribution structure, a plurality of chips, a first molding compound, a second molding compound and a conductive lid. The chips is disposed over the redistribution structure. The first molding compound is disposed over the redistribution structure and encapsulates the chips. The second molding compound is disposed over the redistribution structure and surrounds the first molding compound. The conductive lid covers the chips over the redistribution structure.

In accordance with yet alternative embodiments of the present disclosure, a method of forming a semiconductor package includes at least the following steps. A plurality of package units is provided over a first carrier, wherein at least one of the plurality of package units comprises a plurality of chips encapsulated by a first molding compound and a first redistribution structure disposed over the plurality of chips and the first molding compound. The plurality of package units is encapsulated by a second molding compound. A second redistribution structure is formed over the plurality of package units. The package units and the second redistribution structure thereon are diced to form the semiconductor package, wherein the semiconductor package comprises the package unit, the second molding compound and a portion of the second redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a plurality of chips, wherein one of the plurality of chips comprises a protection layer;
a first molding compound, encapsulating the plurality of chips, and a material of the protection layer is different from a material of the first molding compound;
a first redistribution structure, disposed over the plurality of chips and the first molding compound, wherein the first redistribution structure is in contact with the protection layer;
a second molding compound, surrounding the first molding compound, wherein the second molding compound covers the first redistribution structure; and
a second redistribution structure, disposed over the first redistribution structure, the first molding compound and the second molding compound.

2. The semiconductor package of claim 1, wherein the second molding compound is directly contact with the first molding compound, and an interface is formed between the first molding compound and the second molding compound.

3. The semiconductor package of claim 1, wherein the second molding compound is not disposed between the plurality of chips.

4. The semiconductor package of claim 1, wherein the first redistribution structure comprises a plurality of connecting pads, and the plurality of connecting pads is directly contact with the second redistribution structure.

5. The semiconductor package of claim 1, wherein at one side, edges of the second redistribution structure, the first redistribution structure and the outermost chip of the plurality of chips form a step.

6. The semiconductor package of claim 1, wherein sides of the first redistribution structure are substantially aligned with sides of the first molding compound.

7. A semiconductor package, comprising:
a redistribution structure;
a plurality of chips, disposed over the redistribution structure;
a first molding compound, disposed over the redistribution structure and encapsulating the plurality of chips, wherein the first molding compound is not horizontally extended between active surfaces of the plurality of chips and the redistribution structure;
a second molding compound, covering the redistribution structure and surrounding the first molding compound; and
a conductive lid, covering the plurality of chips over the redistribution structure.

8. The semiconductor package of claim 7, wherein sides of the conductive lid are encapsulated by the second molding compound.

9. The semiconductor package of claim 7, wherein sides of the conductive lid are exposed.

10. The semiconductor package of claim 7, wherein the first molding compound is covered by the conductive lid.

11. The semiconductor package of claim 7, wherein the second molding compound is covered by the conductive lid.

12. The semiconductor package of claim 7 further comprising an adhesive layer disposed between the conductive lid and the plurality of chips, wherein the adhesive layer is not disposed between the conductive lid and at least one of the first molding compound and the second molding compound.

13. A method of forming a semiconductor package, comprising:
providing a plurality of package units over a first carrier, wherein at least one of the plurality of package units comprises a plurality of chips encapsulated by a first molding compound and a first redistribution structure disposed over the plurality of chips and the first molding compound, wherein the first molding compound is not horizontally extended between active surfaces of the plurality of chips and the first redistribution structure;
encapsulating the plurality of package units by a second molding compound;
forming a second redistribution structure over the plurality of package units; and
dicing the plurality of package units and the second redistribution structure thereon to form the semiconductor package, wherein the semiconductor package comprises the package unit, the second molding compound and a portion of the second redistribution structure.

14. The method of claim 13, wherein a forming method of the at least one of the plurality of package units comprises:
providing the plurality of chips over a second carrier;
encapsulating the plurality of chips by the first molding compound; and
forming the first redistribution structure over the plurality of chips and the first molding compound.

15. The method of claim 14 further comprising removing the second carrier before the step of providing a plurality of package units over a first carrier.

16. The method of claim 14, wherein one of the first and second carriers is a conductive carrier, and the diced package unit comprises the conductive carrier as a conductive lid.

17. The method of claim 13 further comprising removing the first carrier after dicing.

18. The method of claim 13 further comprising forming a plurality of connectors over the diced package unit.

19. The method of claim 13 further comprising forming a conductive lid over the diced package unit.

20. The method of claim 1, wherein a sidewall of the protection layer is flush with a sidewall of the bottom.

* * * * *